(12) United States Patent
Kang et al.

(10) Patent No.: US 7,368,811 B2
(45) Date of Patent: May 6, 2008

(54) MULTI-CHIP PACKAGE AND METHOD FOR MANUFACTURING THE SAME

(75) Inventors: In-Ku Kang, Cheonan-si (KR); Tae-Gyeong Chung, Suwon-si (KR); Sang-Ho An, Suwon-si (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 233 days.

(21) Appl. No.: 11/103,479

(22) Filed: Apr. 12, 2005

(65) Prior Publication Data

US 2006/0071317 A1 Apr. 6, 2006

(30) Foreign Application Priority Data

Oct. 4, 2004 (KR) .................. 10-2004-0078790

(51) Int. Cl.
*H01L 23/02* (2006.01)
(52) U.S. Cl. ............... 257/686; 257/777; 257/E23.085; 438/109
(58) Field of Classification Search ................ 257/686, 257/777, E23.085; 438/109
See application file for complete search history.

(56) References Cited

U.S. PATENT DOCUMENTS 5,721,452 A * 2/1998 Fogal et al. ................ 257/685
6,337,226 B1   1/2002 Symons
6,664,643 B2 * 12/2003 Emoto ........................ 257/777
7,166,924 B2 *  1/2007 Lu et al. ..................... 257/777
2002/0125556 A1 *  9/2002 Oh et al. .................... 257/685
2004/0262774 A1 * 12/2004 Kang et al. ................. 257/777

FOREIGN PATENT DOCUMENTS

| JP | 07-221262 | 8/1995 |
| JP | 2001-320014 | 11/2001 |
| KR | 10-0393094 | 7/2003 |

OTHER PUBLICATIONS

Korean Patent Office Action dated Jan. 13, 2006.

* cited by examiner

*Primary Examiner*—Phat X Cao
(74) *Attorney, Agent, or Firm*—Harness, Dickey & Pierce, PLC

(57) ABSTRACT

A multi-chip package and method for manufacturing are disclosed. The multi-chip package may include a substrate, a lower semiconductor chip mounted on the substrate, a first electrical connection for electrically connecting the substrate and the lower semiconductor chip, an upper semiconductor chip attached to the lower semiconductor chip and having overhang portions, and at least one bump interposed between the substrate and the overhang portions. The at least one bump may support the overhang portions and may be formed when the first electrical connection is formed.

23 Claims, 5 Drawing Sheets

MULTI-CHIP PACKAGE AND METHOD FOR MANUFACTURING THE SAME

CROSS REFERENCE TO RELATED APPLICATIONS

This U.S. non-provisional application claims benefit of priority under 35 U.S.C. §119 to Korean Patent Application No. 2004-78790, filed on Oct. 4, 2004, in the Korean Intellectual Property Office, the contents of which are incorporated by reference in their entirety.

BACKGROUND OF THE INVENTION

1. Field of the Invention

Example embodiments of the present invention may generally relate to a semiconductor chip stack structure and method thereof, and more particularly, to a multi-chip package and a method for manufacturing the multi-chip package.

2. Description of the Related Art

With the reduction in size of today's portable electronic devices, semiconductor packages are also moving toward a reduction in size. To meet the demands for smaller packaging, multi-chip packaging techniques have been introduced, for example. Multi-chip packages (MCPs) may include a plurality of semiconductor chips in a single package. MCPs may produce high integration, size reduction and/or lighter weight.

FIG. 1 is a perspective view of a conventional multi-chip package. FIG. 2 is a cross-sectional view taken along the line of I-I' of FIG. 1.

Referring to FIGS. 1 and 2, the conventional multi-chip package may include a substrate 21 and semiconductor chips 23 and 25. The semiconductor chip 23 is hereinafter referred to as a lower semiconductor chip and the semiconductor chip 25 is hereinafter referred to as an upper semiconductor chip. The upper semiconductor chip 25 may be stacked on the lower semiconductor chip 23, for example, which may be called an overhang type chip stack structure. The lower and upper semiconductor chips 23 and 25 may have the same size and/or function. The lower semiconductor chip 23 may be attached to the substrate 21 using a lower adhesive 22. The upper semiconductor chip 25 may be attached to the lower semiconductor chip 23 using an upper adhesive 27. The lower and upper semiconductor chips 23 and 25 may be rectangular semiconductor chips (e.g., a side D1 of the upper semiconductor chip 25 may be longer than a side D2 of the lower semiconductor chip 23, as shown in FIG. 2). Therefore, the upper semiconductor chip 25 may have overhang portions H1 at one or more ends, as also shown in FIG. 2.

The substrate 21 may have first substrate pads 31 and second substrate pads 35. The lower semiconductor chip 23 may have lower chip pads 23a formed along opposite edges. The lower chip pads 23a may be connected to the first substrate pads 31 of the substrate 21 using first bonding wires 29. Similarly, the upper semiconductor chip 25 may have upper chip pads 25a formed along opposite edges. The upper chip pads 25a may be connected to the second substrate pads 35 of the substrate 21 using second bonding wires 33. The first and second bonding wires 29 and 33 may be formed using, for example, a capillary 41.

During a wire bonding process, a conventional multi-chip package may encounter problems, for example, contact failures and/or crack generation of the semiconductor chips. Specifically, the capillary 41 may apply a downward force on the upper chip pads 25a when forming the second bonding wires 33. The pressing force of the capillary 41 may warp and/or bend the upper semiconductor chip 25 in the direction of A1 and/or A2. As a result, this may lead to contact failures between the second bonding wires 33 and the upper chip pads 25a of the upper semiconductor chip 25. Further, warpage or bending of the upper semiconductor chip 25 may create cracks at the overhang portion H1, thereby increasing the defect ratio in a semiconductor manufacturing process. Such problems may be significant when the thickness of the semiconductor chip 25 is reduced, the thickness of the semiconductor chip 23 is increased, and/or the length L of the overhang portion H1 is increased.

Conventionally, in order to solve the above problems, a rest member or other support member may be interposed between an upper semiconductor chip and a substrate to prevent and/or reduce warpage of the upper semiconductor chip. However, the conventional art may require additional processes for forming the rest member or support member between the upper semiconductor chip and the substrate, which may reduce the productivity during a semiconductor manufacturing process and/or may increase manufacturing costs.

SUMMARY OF THE INVENTION

Example embodiments of the present invention may be directed to a multi-chip package that may reduce and/or prevent overhang portions of an upper semiconductor chip from warpage and/or cracks.

Example embodiments of the present invention may be directed to a method for manufacturing a multi-chip package which may use a conventional manufacturing apparatus. The conventional manufacturing apparatus may be a typical wire bonding apparatus used for forming the bonding wires and the bump group, so as to reduce the time and/or cost of a semiconductor manufacturing process.

In an example embodiment, the multi-chip package may include a substrate, a lower semiconductor chip mounted on the substrate, a first electrical connection for electrically connecting the substrate and the lower semiconductor chip, an upper semiconductor chip attached to the lower semiconductor chip, the upper semiconductor chip having overhang portions, and at least one bump interposed between the substrate and the overhang portions and may support the overhang portions, wherein the at least one bump may be formed while the first electrical connection is formed.

In another example embodiment, the multi-chip package may include a substrate, a lower semiconductor chip mounted on the substrate, electrically connected to the substrate by a connection process including at least one subprocess, an upper semiconductor chip attached to the lower semiconductor chip, the upper semiconductor chip having at least one overhang portion, and at least one support, formed using the at least one subprocess of the connection process, interposed between the substrate and the at least one overhang portion, to support the at least one overhang portion.

In another example embodiment, the lower and upper semiconductor chips may be generally rectangular semiconductor chips. The lower semiconductor chip may have chip pads arranged along opposite edges of the lower semiconductor chip and the upper semiconductor chip may have chip pads arranged along the opposite edges of the upper semiconductor chip.

In another example embodiment, the at least one bump may include a plurality of bumps to form a bump group.

In yet another example embodiment, the bump group may include an uppermost bump. The uppermost bump may have a protrusion formed at a top side.

In another example embodiment, the substrate may include a first projection area where the bump is projected on the substrate and a second projection area where the chip pad of the upper semiconductor chip is projected to the substrate, and a center of the projection area may be located within the first projection area and the second projection area.

In another example embodiment, the substrate may further include dummy pads. The dummy pads may be electrically isolated and co-located with the at least one bump.

In another example embodiment, the multi-package may include a second electrical connection for electrically connecting the substrate and the upper semiconductor chip.

In another example embodiment, the first and second electrical connections may include bonding wires.

In yet another example embodiment, the multi-package may include an adhesive layer formed on a lower surface of the upper semiconductor chip, and the protrusion of the uppermost bump of the bump group may be inserted into the adhesive layer.

In yet another example embodiment, the adhesive layer may include an adhesive tape covering the entire lower surface of the upper semiconductor chip.

In another example embodiment, a method for manufacturing a multi-chip package is disclosed. The method may include providing a substrate having first substrate pads and second substrate pads, the substrate having a lower semiconductor chip mounted thereon and electrically connecting the lower semiconductor chip to the first substrate pads, forming at least one bump on the substrate, and attaching an upper semiconductor chip to the lower semiconductor chip, the upper semiconductor chip having overhang portions and may support the overhang portions, wherein the at least one bump is formed while the lower semiconductor chip is electrically connected to the first substrate pads.

In another example embodiment, a method for manufacturing a multi-chip package is disclosed. The method may include providing a substrate having substrate pads, electrically connecting a lower semiconductor chip to the substrate pads with a connection process including at least one subprocess, forming at least one support on the substrate using the at least one subprocess of the connection process, and attaching an upper semiconductor chip to the lower semiconductor chip, the upper semiconductor chip having at least one overhang portion, the at least one support supporting the at least one overhang portion.

In another example embodiment, forming the at least one bump may include forming a bump group having a plurality of bumps.

In another example embodiment, the bump group may include an uppermost bump. The uppermost bump may have a protrusion at a top side.

In yet another example embodiment, the method may include an adhesive layer formed on a lower surface of the upper semiconductor chip, and the protrusion of the uppermost bump of the bump group may be inserted into the adhesive layer.

In another example embodiment, the method may include providing dummy pads on the substrate so as to be electrically isolated and co-located with the at least one bump.

In another example embodiment, the upper semiconductor may be electrically connected to the second substrate pads.

In yet another example embodiment, the lower semiconductor chip may be electrically connecting to the first substrate pad by bonding wires using a wire bonding apparatus of a wire bonding process.

In yet another example embodiment, the at least one bump may be formed using the wire bonding process.

In yet other example embodiment, the upper semiconductor chip may be electrically connected to the second substrate pad by bonding wires using the wire bonding process.

BRIEF DESCRIPTION OF THE DRAWINGS

Example embodiments of the present invention will be readily understood with reference to the following detailed description thereof provided in conjunction with the accompanying drawings, wherein like reference numerals designate like structural elements.

Figure 1:
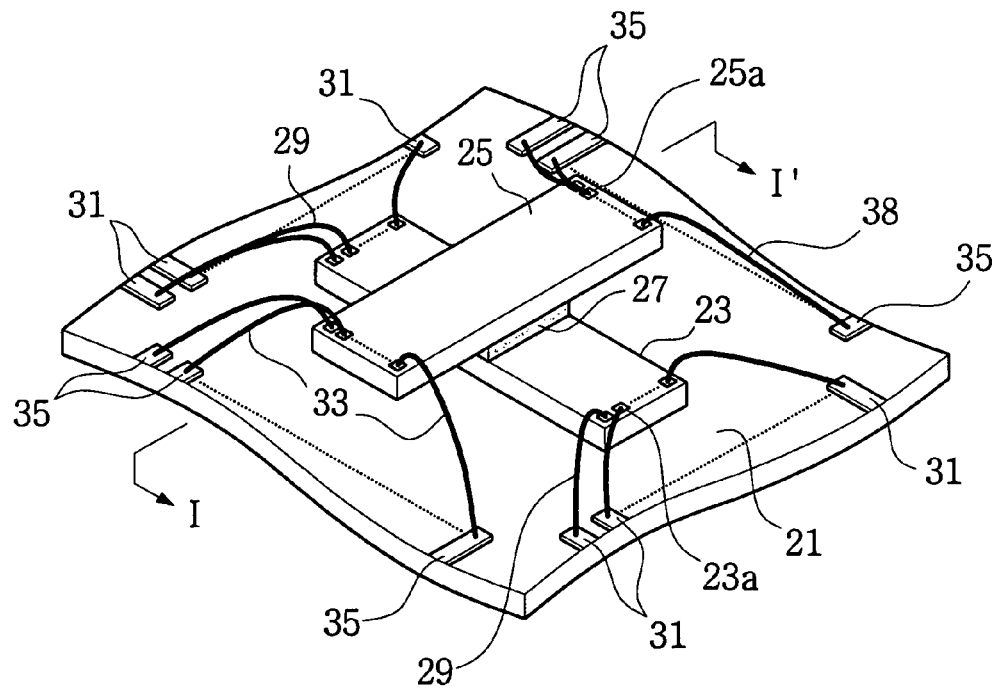
FIG. 1 is a perspective view of a conventional multi-chip package.
Figure 2:
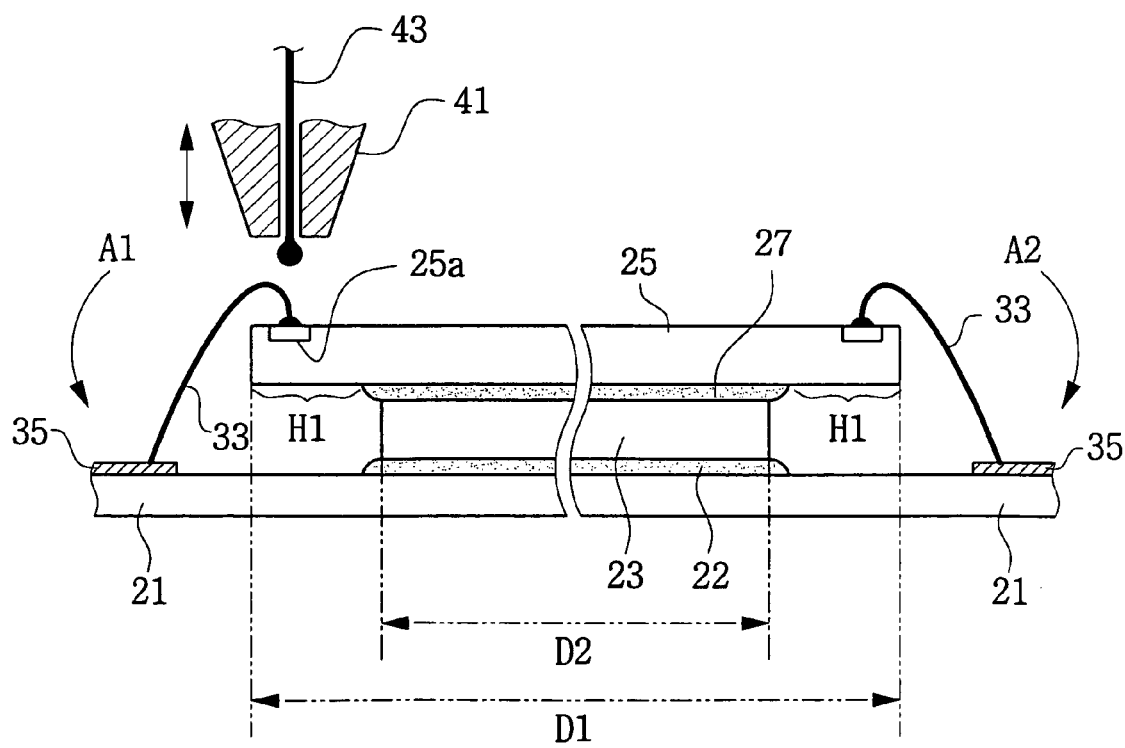
FIG. 2 is a cross-sectional view taken along the line of I-I' of FIG. 1.

These drawings are provided for illustrative purposes only and are not drawn to scale. The spatial relationships and relative sizing of the elements illustrated in the various embodiments may have been reduced, expanded or rearranged to improve the clarity of the figure with respect to the corresponding description. The figures, therefore, should not be interpreted as accurately reflecting the relative sizing or positioning of the corresponding structural elements that could be encompassed by an actual device manufactured according to the example embodiments of the invention.

DETAILED DESCRIPTION OF EXAMPLE EMBODIMENTS

Example, non-limiting embodiments of the present invention will now be described more fully hereinafter with reference to the accompanying drawings. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. The principles and feature of this invention may be employed in varied and numerous embodiments without departing from the scope of the invention.

It should be noted that these figures are intended to illustrate the general characteristics of methods and devices of example embodiments of this invention, for the purpose of the description of such example embodiments herein. These drawings are not, however, to scale and may not precisely reflect the characteristics of any given embodiment, and should not be interpreted as defining or limiting the range of values or properties of example embodiments within the scope of this invention. Rather, for simplicity and clarity of illustration, the dimensions of some of the elements are exaggerated relative to other elements.

In particular, the relative thicknesses and positioning of layers or regions may be reduced or exaggerated for clarity. Further, a layer is considered as being formed "on" another layer or a substrate when formed either directly on the referenced layer or the substrate or formed on other layers or patterns overlaying the referenced layer. Further, it will be understood that when a layer is referred to as being "on" or "formed over" another layer or substrate, the layer may be directly on the other layer or substrate, or intervening layer(s) may also be present.

Further, well-known structures and processes are not described or illustrated in detail to avoid obscuring example embodiments of the present invention. Like reference numerals are used for like and corresponding parts of the various drawings.

Figure 3:
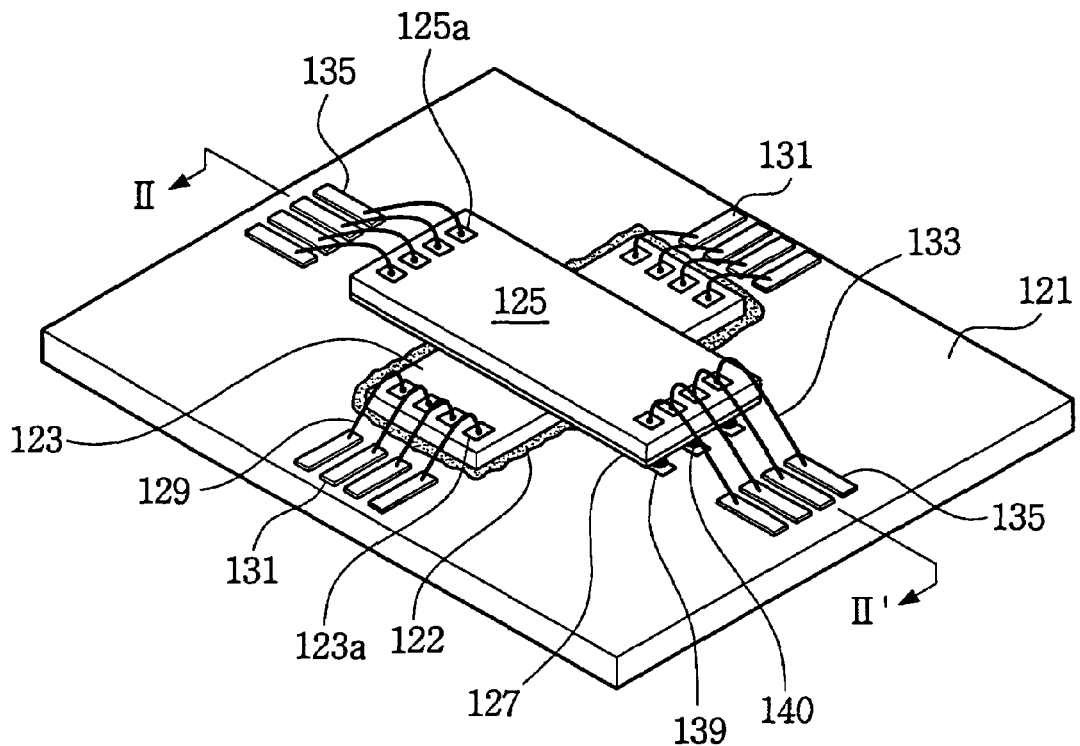
FIG. 3 is a perspective view of a multi-chip package in accordance with an example, non-limiting embodiment of the present invention.
Figure 4:
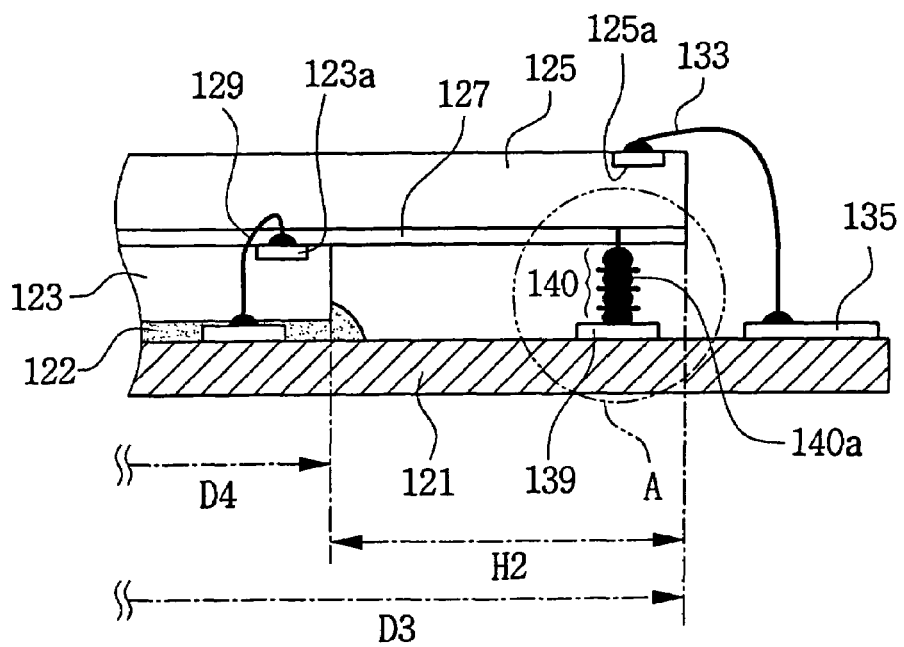
FIG. 4 is a cross-sectional view taken along the line of II-II' of FIG. 3.

FIG. 3 is a perspective view of a multi-chip package in accordance with an example, non-limiting embodiment of the present invention. FIG. 4 is a cross-sectional view taken along the line of II-II' of FIG. 3.

Referring to FIGS. 3 and 4, a lower semiconductor chip 123 and an upper semiconductor chip 125 may be stacked on a substrate 121, for example in a so-called overhang type chip stack structure. The lower and upper semiconductor chips 123 and 125 may have generally the same size and/or function. The lower semiconductor chip 123 may be attached to the substrate 121 using an adhesive 122. The upper semiconductor chip 125 may be attached to the lower semiconductor chip 123 using for example an adhesive 127. However, it should be appreciated that other attachments besides adhesives may be employed to attach the semiconductors chips or the semiconductor chip to the substrate. The lower and upper semiconductor chips 123 and 125 may be generally rectangular in shape (e.g., side D3 of the upper semiconductor chip 125 may be longer than side D4 of the lower semiconductor chip 123). As a result, the upper semiconductor chip 125 may have overhang portions H2 at opposite ends. The overhang portions H2 may not be directly supported by the lower semiconductor chip 123.

The substrate 121 may have first substrate pads 131 and second substrate pads 135. The lower semiconductor chip 123 may have lower chip pads 123a arranged along opposite edges of the active surface of the lower semiconductor chip 123. The lower chip pads 123a may be electrically connected to the first substrate pads 131 using, for example, first bonding wires 129. Similarly, the upper semiconductor chip 125 may have upper chip pads 125a arranged along opposite edges of the active surface of upper semiconductor chip 125. The upper chip pads 125a may be electrically connected to the second substrate pads 135 using, for example, second bonding wires 133.

Referring to FIG. 4, a plurality of bumps 140a may form a bump group 140, as indicated at "A". The bump group 140 may support the overhang portion H2 of the upper semiconductor chip 125. The plurality of bumps 140a may be a solder bump and/or a stud bump. It should also be appreciated by one skilled in the art that balls, pads and/or other support members may be employed. In an example embodiment, the bump group 140 may be located on the substrate 121 corresponding to upper chip pads 125a of the upper semiconductor chip 125.

However, it should be appreciated by one skilled in the art that a bump group 140 may be located anywhere in the overhang portion H2. As a result, the bump group 140 may reduce and/or prevent the upper semiconductor chip 125 from warpage and/or cracks which may occur due to the pressing of a capillary against the upper chip pads 125a during a wire bonding process. In other words, a first projection area applied via the capillary may be where the bump group 140 is projected from the substrate 121. A second projection area may be where the upper chip pad 125a is projected to the substrate 121. The center of the projection area may be located within the first projection area and the second projection area.

An encapsulant (not shown) may seal the lower semiconductor chip 123, the upper semiconductor chip 125, and the first and second bonding wires 129 and 133. A plurality of external connection terminals, for example, but not limited to, solder balls (not shown) may be formed on the bottom surface of the substrate 121. It should be appreciated that other external connection terminals may be employed, for example, connection pins and/or landing pads.

Figure 5:
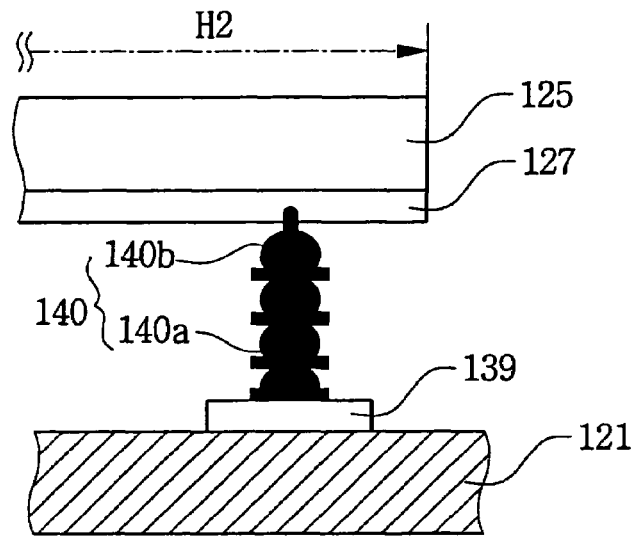
FIG. 5 is an enlarged view of section A of FIG. 4.

Referring to FIG. 5, the bumps 140a may be stacked generally vertically between the substrate 121 and the upper semiconductor chip 125. A plurality of the bumps 140a may form the bump group 140. However, it should be appreciated that a single bump 140a may be employed depending on the size (i.e., height) of the lower semiconductor chip 123. The bump group 140 may be located on a dummy pad 139 on the substrate 121. The dummy pad 139 may be electrically isolated. The uppermost bump 140b of the bump group 140 may have a generally pointed end or protrusion formed at the top side. The top end or protrusion of the uppermost bump 140b may be inserted into the adhesive layer 127. Therefore, the bump group 140 may stably support the overhang portion H2. The adhesive layer 127 may be formed on the lower surface of the upper semiconductor chip 125. Alternatively, the adhesive layer may be formed on the upper surface of the lower semiconductor chip 123. Further, in an alternative example embodiment, the adhesive layer may be an adhesive tape covering the entire or portion of lower surface of the upper semiconductor chip 125.

As described above, in example embodiments of the present invention, at least one support for a multi-chip package with at least one overhang portion may be formed by a subprocess of a process used to electrically connect one or more of the semiconductor chips to a substrate or to each other. In example embodiments, as described above, a wire bonding process is used to electrically connect one or more of the semiconductor chips to a substrate or to each other. In example embodiments, a subprocess of the wire bonding process, forming a pad, ball, and/or bump may be used to form the at least one support. In such example embodiments, an additional process for forming the at least one support is unnecessary, a conventional apparatus may be used (for example, a conventional wire bonding apparatus), and/or semiconductor processing efficiency may be improved.

Although example embodiment of the present invention describe wire bonding as a process and forming a pad, ball, and/or bump as subprocesses, other processes and/or subprocesses may also be used.

A method for manufacturing a multi-chip package in accordance to an example embodiment of the present invention will herein be described with reference to FIGS. 6 through 8.

Figure 6:
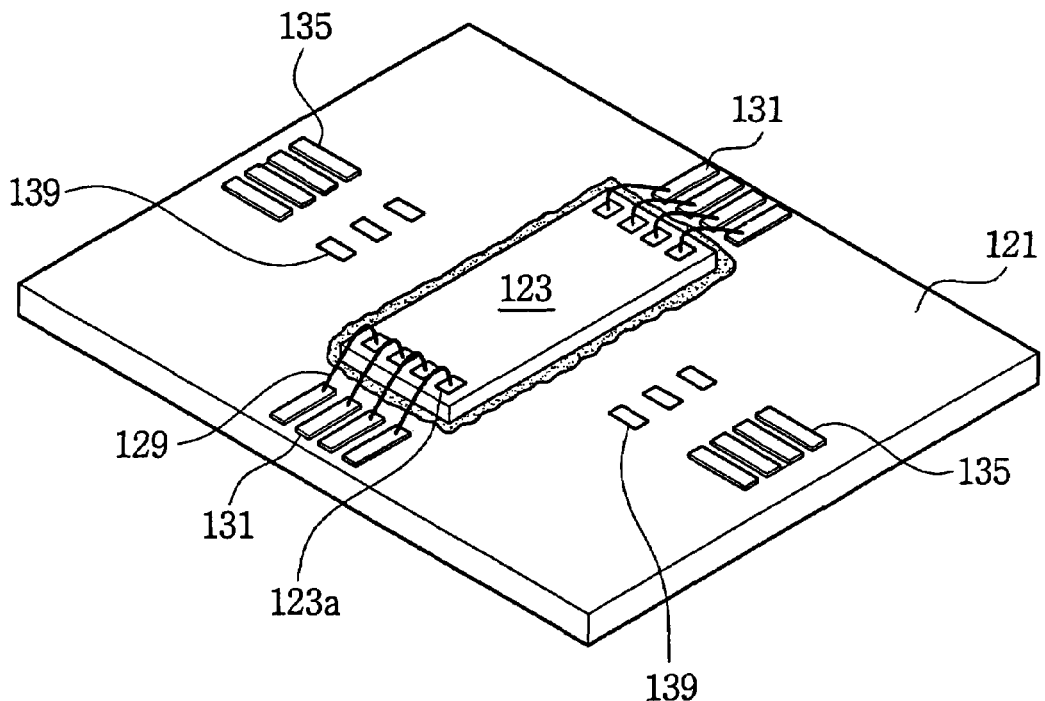
FIGS. 6 through 8 are perspective views of a method for manufacturing a multi-chip package in accordance with an example, non-limiting embodiment of the present invention.

Referring to FIG. 6, a substrate 121 may be provided. The substrate 121 may include a printed circuit board. The substrate 121 may include first substrate pads 131, second substrate pads 135 and dummy pads 139. The first and second substrate pads 131 and 135 may be electrically connected to solder ball pads (not shown) or other connectors formed on the bottom surface of the substrate 121. It should be appreciated that landing pads and/or connection pins may be used instead of solder ball pads. The dummy pads 139 may be electrically isolated. The substrate 121 may have a lower semiconductor chip 123 mounted using, for example, an adhesive (122 of FIG. 4). It should be appreciated that other attachments may be employed to attach the lower semiconductor chip 123 to the substrate.

The lower semiconductor chip 123 may have lower chip pads 123a formed along opposite edges of the active surface of lower semiconductor chip 123. The lower chip pads 123a may be electrically connected to the first substrate pads 131 using first bonding wires 129. The first bonding wires 129 may be formed by a conventional wire bonding technique using, for example, but not limited to, a wire bonding apparatus (not shown).

Figure 7:
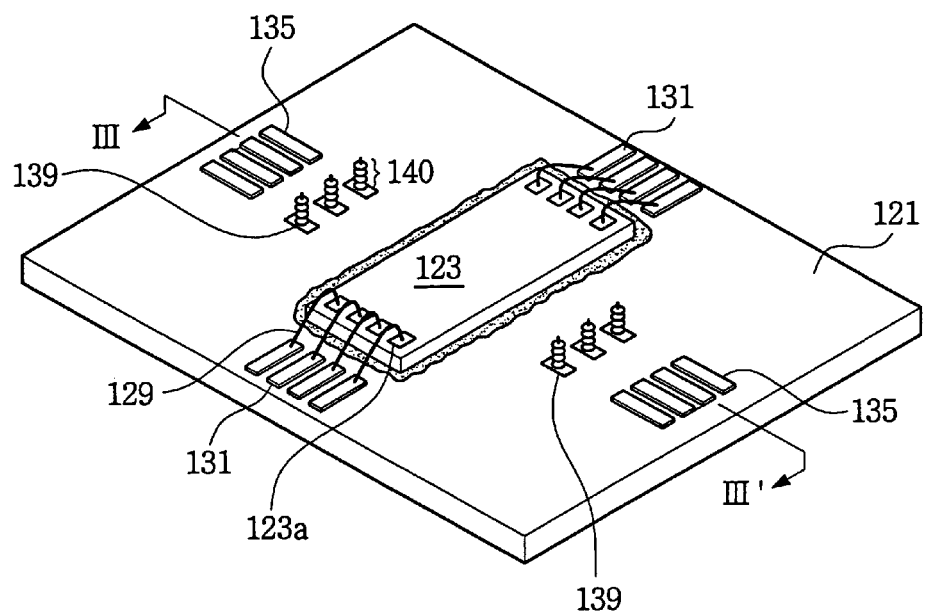

Referring to FIG. 7, a bump group 140 may be formed on the substrate 121 using, for example, but not limited to, a conventional wire bonding technique. Formation of the bump group 140 may be made by the wire bonding apparatus used in forming the first bonding wires 129. This may eliminate the need for additional processes and/or apparatus for forming the bump group 140, thereby reducing the time and/or cost of a semiconductor manufacturing process.

Figure 9:
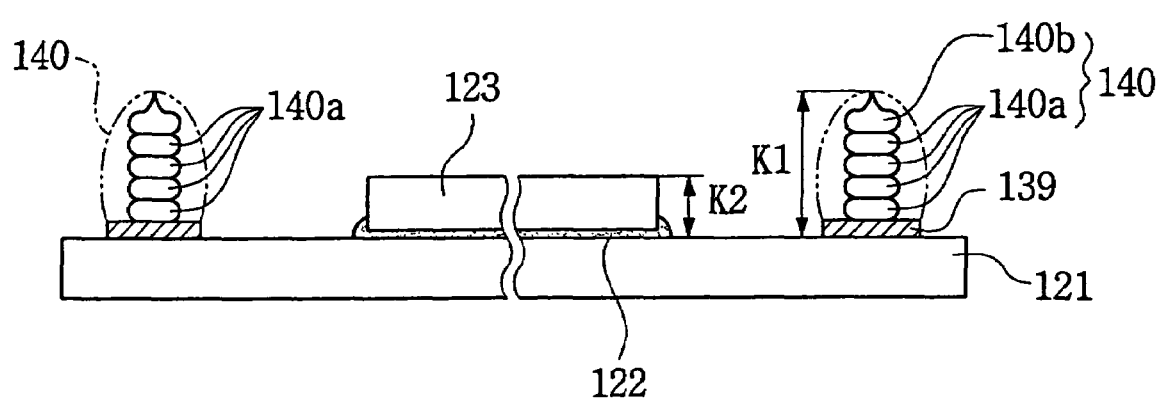
FIG. 9 is a cross-sectional view taken along the line of III-III' of FIG. 7.

Referring to FIG. 9, the bump group 140 may include a plurality of bumps 140a. However, it should be appreciated that bump 140a may be a single bump. As an example embodiment, the height of the bump group 140 should be greater than the height of the lower semiconductor chip 123. In other words, the distance K1 from the top surface of the substrate 121 to the top end of the bump group 140 may be greater than or equal to the distance K2 from the top surface of the substrate 121 to the upper surface of the lower semiconductor chip 123. The bump group 140 may support the overhang portions H2 and/or the adhesive tape 127 of the upper semiconductor chip 125 corresponding to the overhang portions H2. Therefore, the bump group 140 may reduce and/or prevent warpage which may occur at the overhang portions H2 of the upper semiconductor chip 125. The uppermost bump 140a of the bump group 140 may have generally a pointed end or protrusion formed at the top side thereof.

Figure 8:
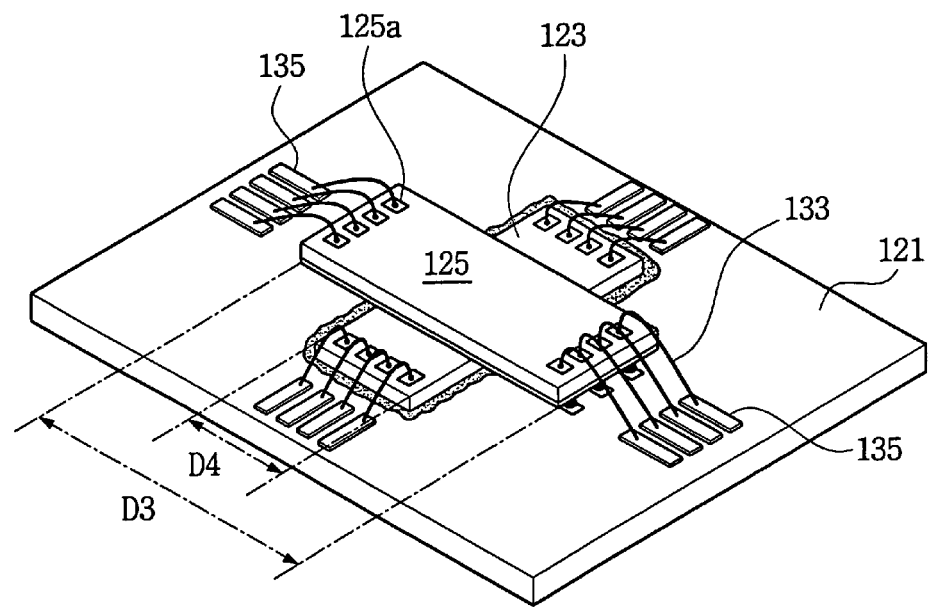

Referring to FIG. 8, the upper semiconductor chip 125 may be attached to the lower semiconductor chip 123. The upper semiconductor chip 125 may have the adhesive tape (127 of FIG. 4) formed on the lower surface of the upper semiconductor chip 125. The top end of the uppermost bump 140a of the bump group 140 may be inserted into the adhesive tape 127.

The lower and upper semiconductor chips 123 and 125 may be generally rectangular in shape. The upper semiconductor chip 125 may be stacked on the lower semiconductor chip 123 in an overhang type chip stack structure. The side D3 of the upper semiconductor chip 125 may be longer than the side D4 of the lower semiconductor chip 123. The upper semiconductor chip 125 may have upper chip pads 125a formed along opposite edges of the active surface of semiconductor chip 125. The upper chip pads 125a may be electrically connected to the second substrate pads 135 using, for example, second bonding wires 133. The second bonding wires 133 may be formed by, for example, a conventional wire bonding technique using a wire bonding apparatus. Formation of the second bonding wires 133 may be made by the wire bonding apparatus used in forming the bump group 140.

As described above, in example embodiments of the present invention, at least one support for a multi-chip package with at least one overhang portion may be formed by a subprocess of a process used to electrically connect one or more of the semiconductor chips to a substrate or to each other. In example embodiments, as described above, a wire bonding process is used to electrically connect one or more of the semiconductor chips to a substrate or to each other. In example embodiments, a subprocess of the wire bonding process, forming a pad, ball, and/or bump may be used to form the at least one support. In such example embodiments, an additional process for forming the at least one support is unnecessary, a conventional apparatus may be used (for example, a conventional wire bonding apparatus), and/or semiconductor processing efficiency may be improved.

Although example embodiment of the present invention describe wire bonding as a process and forming a pad, ball, and/or bump as subprocesses, other processes and/or subprocesses may also be used.

An encapsulant (not shown) may be formed on the substrate 121. The encapsulant may seal the lower semiconductor chip 123, the upper semiconductor chip 125, and the first and second bonding wires 129 and 133. A plurality of external connection terminals, for example solder balls (not shown) may be formed on the bottom surface of the substrate 121. It should be appreciated that other external connection terminals may be employed, for example, connection pins and/or landing pads. In accordance with the example embodiments of the present invention, a bump group may support overhang portions of an upper semiconductor chip. The bump group may reduce warpage and/or cracks. As the bump group may be formed by a conventional wire bonding technique along with the first and second bonding wires 129 and 133, this may eliminate the need for additional processes and/or apparatus for forming the bump group, and thus reduce the time and/or cost of a semiconductor manufacturing process. Further, the conventional wire bonding technique may adjust the height of the bumps by determining the amount of plurality of bumps desired. The bump group may be fitted between the substrate and the adhesive tape of the upper semiconductor chip.

Although the example embodiments of the present invention describes "bump group" as a plurality of bumps having solder bumps and/or stud bumps, it should be appreciated that a bump group may be described as any member that may support the overhang portions of the upper semiconductor chip.

Although example, non-limiting embodiments of the present invention have been described in detail hereinabove, it should be understood that many variations and/or modifications of the basic inventive concepts herein taught, which may appear to those skilled in the art, will still fall within the spirit and scope of the example embodiments of the present invention as defined in the appended claims.

What is claimed is:

1. A multi-chip package, comprising:
   a substrate;
   a lower semiconductor chip mounted on the substrate;
   a first electrical connection for electrically connecting the substrate and the lower semiconductor chip;
   an upper semiconductor chip attached to the lower semiconductor chip, the upper semiconductor chip having overhang portions extending beyond the lower semiconductor chip in a direction parallel to a surface of the substrate;
   at least one bump having a protrusion, the at least one bump being between the substrate and the overhang portions, the at least one bump supporting the overhang portions; and
   an adhesive layer on a lower surface of the upper semiconductor chip, the protrusion being inserted into the adhesive layer.

2. The multi-chip package of claim 1, wherein the lower and upper semiconductor chips are generally rectangular semiconductor chips, the lower semiconductor chip has chip pads arranged along opposite edges of the lower semiconductor chip substrate, and the upper semiconductor chip has chip pads arranged along the opposite edges of the upper semiconductor chip.

3. The multi-chip package of claim 1, wherein the at least one bump includes a plurality of bumps and the plurality of bumps form a bump group.

4. The multi-chip package of claim 3, wherein the bump group includes an uppermost bump, the protrusion being formed on a top side of the uppermost bump.

5. The multi-chip package of claim 2, wherein the substrate includes a first projection area where the bump is projected on the substrate and a second projection area where the chip pad of the upper semiconductor chip is projected to the substrate, and a center of the projection area is located within the first projection area and the second projection area.

6. The multi-chip package of claim 1, wherein the substrate further includes dummy pads electrically isolated and co-located with the at least one bump.

7. The multi-chip package of claim 1, further comprising:
a second electrical connection for electrically connecting the substrate and the upper semiconductor chip.

8. The multi-chip package of claim 7, wherein the first and second electrical connections include bonding wires.

9. The multi-chip package of claim 1, wherein the adhesive layer includes an adhesive tape covering the entire lower surface of the upper semiconductor chip.

10. A method for manufacturing a multi-chip package, the method comprising:
providing a substrate having first substrate pads and second substrate pads, the substrate having a lower semiconductor chip mounted thereon and electrically connecting the lower semiconductor chip to the first substrate pads;
forming at least one bump having a protrusion on the substrate; and
attaching an upper semiconductor chip to the lower semiconductor chip with an adhesive layer on a lower surface of the upper semiconductor chip, the upper semiconductor chip having overhang portions extending beyond the lower semiconductor chip in a direction parallel to a surface of the substrate, such that the at least one bump is between the substrate and the overhang portions and supports the overhang portions, the protrusion being inserted into the adhesive layer,
wherein the at least one bump is formed while the lower semiconductor chip is electrically connected to the first substrate pads.

11. The method of claim 10, wherein forming the at least one bump includes forming a bump group having a plurality of bumps.

12. The method of claim 11, wherein the bump group includes an uppermost bump, the uppermost bump including a protrusion at a top side.

13. The method of claim 12, further comprising an adhesive layer on a lower surface of the upper semiconductor chip, and inserting the protrusion of the uppermost bump of the bump group into the adhesive layer.

14. The method of claim 10, further comprising providing dummy pads on the substrate so as to be electrically isolated and co-located with the at least one bump.

15. The method of claim 10, further comprising electrically connecting the upper semiconductor to the second substrate pads.

16. The method of claim 11, further comprising electrically connecting the lower semiconductor chip to the first substrate pad by bonding wires using a wire bonding process.

17. The method of claim 16, wherein the at least one bump is formed using the wire bonding process.

18. The method of claim 17, further comprising electrically connecting the upper semiconductor chip to the second substrate pad by bonding wires using the wire bonding process.

19. A method for manufacturing a multi-chip package, the method comprising:
providing a substrate having substrate pads; electrically connecting a lower semiconductor chip to the substrate pads with a connection process including at least one subprocess;
forming at least one support having a protrusion on the substrate using the at least one subprocess of the connection process; and
attaching an upper semiconductor chip to the lower semiconductor chip with an adhesive layer on a lower surface of the upper semiconductor chip, the upper semiconductor chip having at least one overhang portion extending beyond the lower semiconductor chip in a direction parallel to a surface of the substrate, such that the at least one support is between the substrate and the at least one overhang portion and supports the at least one overhang portion, the protrusion being inserted into the adhesive layer.

20. The method of claim 19, wherein the connection process is a wire bonding process.

21. The method of claim 20, wherein the at least one subprocess includes forming at least one bump.

22. The method of claim 20, wherein the at least one subprocess includes forming a plurality of stacked bumps.

23. The method of claim 19, wherein the at least one support includes a plurality of bumps.

* * * * *